United States Patent
Prakash et al.

(10) Patent No.: US 9,991,211 B2
(45) Date of Patent: Jun. 5, 2018

(54) SEMICONDUCTOR PACKAGE HAVING AN EMI SHIELDING LAYER

(71) Applicant: Intel Corporation, Santa Clara, CA (US)

(72) Inventors: Anna M. Prakash, Chandler, AZ (US); Reynaldo Alberto Olmedo, Phoenix, AZ (US); Venmathy McMahan, Phoenix, AZ (US); Rajendra C. Dias, Phoenix, AZ (US); Joshua David Heppner, Chandler, AZ (US); Ann Jinyan Xu, Chandler, AZ (US); Sriya Sanyal, Chandler, AZ (US); Eric Jin Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/607,270

(22) Filed: May 26, 2017

(65) Prior Publication Data
US 2017/0287851 A1    Oct. 5, 2017

Related U.S. Application Data

(63) Continuation of application No. 15/089,328, filed on Apr. 1, 2016, now Pat. No. 9,685,413.

(51) Int. Cl.
| | |
|---|---|
| *H01L 23/552* | (2006.01) |
| *H01L 23/498* | (2006.01) |
| *H01L 21/48* | (2006.01) |
| *H01L 21/56* | (2006.01) |
| *H01L 23/29* | (2006.01) |

(52) U.S. Cl.
CPC .......... *H01L 23/552* (2013.01); *H01L 21/485* (2013.01); *H01L 21/56* (2013.01); *H01L 23/293* (2013.01); *H01L 23/295* (2013.01); *H01L 23/49838* (2013.01); *H01L 2224/48091* (2013.01); *H01L 2224/48227* (2013.01);
(Continued)

(58) Field of Classification Search
CPC . H01L 23/552; H01L 23/3114; H01L 21/565; H01L 21/485; H01L 23/49838
See application file for complete search history.

(56) References Cited

U.S. PATENT DOCUMENTS

| | | |
|---|---|---|
| 2004/0150091 A1 | 8/2004 | Stobbs |
| 2006/0061406 A1 | 3/2006 | Takatori |

(Continued)

FOREIGN PATENT DOCUMENTS

| | | |
|---|---|---|
| JP | 09-223761 | 8/1997 |
| JP | 2014-110263 | 6/2014 |

OTHER PUBLICATIONS

International Search Report and Written Opinion from PCT/US2017/017704 dated May 29, 2017, 13 pgs.

*Primary Examiner* — Latanya N Crawford
(74) *Attorney, Agent, or Firm* — Schwabe, Williamson & Wyatt, P.C.

(57) ABSTRACT

Semiconductor packages and methods of forming semiconductor packages are described. In an example, a semiconductor package includes a shielding layer containing metal particles, e.g., conductive particles or magnetic particles, in a resin matrix to attenuate electromagnetic interference. In an example, the shielding layer is transferred from a molding chase to the semiconductor package during a polymer molding operation.

14 Claims, 7 Drawing Sheets

(52) U.S. Cl.
CPC ............... *H01L 2924/15311* (2013.01); *H01L 2924/181* (2013.01)

(56) References Cited

U.S. PATENT DOCUMENTS

| | | | |
|---|---|---|---|
| 2013/0082368 A1* | 4/2013 | Kim | H01L 23/295 257/295 |
| 2014/0168902 A1 | 6/2014 | Park et al. | |
| 2015/0076670 A1 | 3/2015 | Pan et al. | |
| 2015/0118792 A1 | 4/2015 | Kawamori et al. | |
| 2016/0073496 A1 | 3/2016 | Vincent | |

* cited by examiner

A - A

C - C

SEMICONDUCTOR PACKAGE HAVING AN EMI SHIELDING LAYER

PRIORITY

The present patent application is a continuation of and claims the benefit of U.S. patent application Ser. No. 15/089,328, titled "Semiconductor Package Having An EMI Shielding Layer," filed Apr. 1, 2016, which is incorporated herein by reference in its entirety.

TECHNICAL FIELD

Embodiments of the invention are in the field of semiconductor packages and, in particular, semiconductor packages having electromagnetic interference shielding and methods of forming such semiconductor packages.

BACKGROUND

Semiconductor packages incorporating integrated circuits are subject to disturbances by electromagnetic interference. Accordingly, to shield semiconductor packages from electromagnetic interference, a molded surface of the semiconductor package may be coated with a conductive material. For example, the conductive material may be sputtered on the molded surface using a physical vapor deposition (PVD) process. The coating process may also include spraying or painting the conductive material on the molding the molded surface.

DESCRIPTION OF EMBODIMENTS

Semiconductor packages having shielding layers to attenuate electromagnetic interference (EMI) are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing EMI shields for semiconductor packages, and methods used to fabricate such shields, have several shortfalls. For example, the tooling used to apply a conductive material using vacuum deposition can be costly. Furthermore, in the case of spray or paint-based EMI shielding, a high presence of volatile organic compound raises environmental concerns. Existing EMI shielding methods can also be costly or difficult to control. For example, extended throughput time is required to increase conductive material thickness, adding to per unit costs. Furthermore, a uniform material coverage on package sidewalls can be difficult to achieve. Also, the processes may be form factor limited, meaning that the conductive material may not be able to reach or obtain a desired thickness within deeper regions of the package. Compounding these shortfalls, an EMI shield fabricated by existing methods may only attenuate EMI having a narrow frequency band, and thus, may not be functionally optimal.

In an aspect, a semiconductor package includes a shielding layer to attenuate EMI. The shielding layer may include metal particles in a resin matrix. More particularly, the shielding layer may be a portion of a mold release film that is transferred from a molding chase to a semiconductor package during a molding process. Accordingly, the shielding layer may be applied to the semiconductor package in a low-cost and efficient process having low levels of volatile organic compounds. The mold release film, and thus the shielding layer, may be uniform and include a predetermined thickness in the nm, micron, or mil range. Furthermore, the metal particles may include conductive particles or magnetic particles having various materials or material properties, and thus, the metal particles may endow the shielding layer with an ability to attenuate EMI having a broad band of both low and high frequencies.

Figure 1:
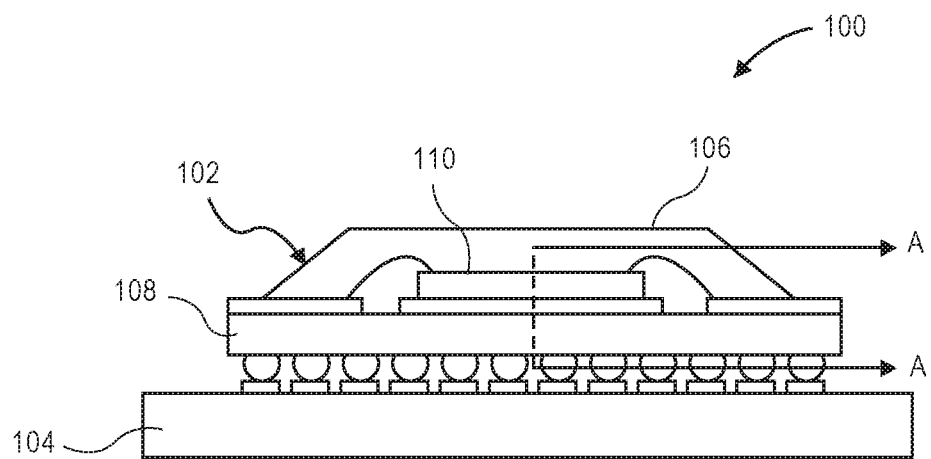
FIG. 1 illustrates a sectional view of a semiconductor package assembly, in accordance with an embodiment.

Referring to FIG. 1, a sectional view of a semiconductor package assembly is shown in accordance with an embodiment. Semiconductor package assembly 100 may include a semiconductor package 102 mounted on a circuit board 104, e.g., a motherboard or another printed circuit board of a computer. Semiconductor package 102 may be one of any of the various types of known semiconductor packages 102. For example, semiconductor package 102 may have a system in package (SiP) design having one or more integrated circuits enclosed in a single module. Semiconductor package 102 may include solder balls attached to corresponding contacts on circuit board 104. Solder balls may function as power/ground pins or as signal pins for I/O of semiconductor package 102.

In an embodiment, semiconductor package 102 includes a top package portion 106, e.g., a heat spreader, which forms a shell above a package substrate 108. More particularly, top package portion 106 may be overmolded on package substrate 108 to enclose a semiconductor die 110, e.g., a silicon-based integrated circuit, of semiconductor package 102. Semiconductor die 110 may be mounted on package substrate 108. Accordingly, package substrate 108 may act as an intermediate structure to mount semiconductor die 110 on circuit board 104 and to carry electrical signals between semiconductor die 110 and circuit board 104.

Figure 2:
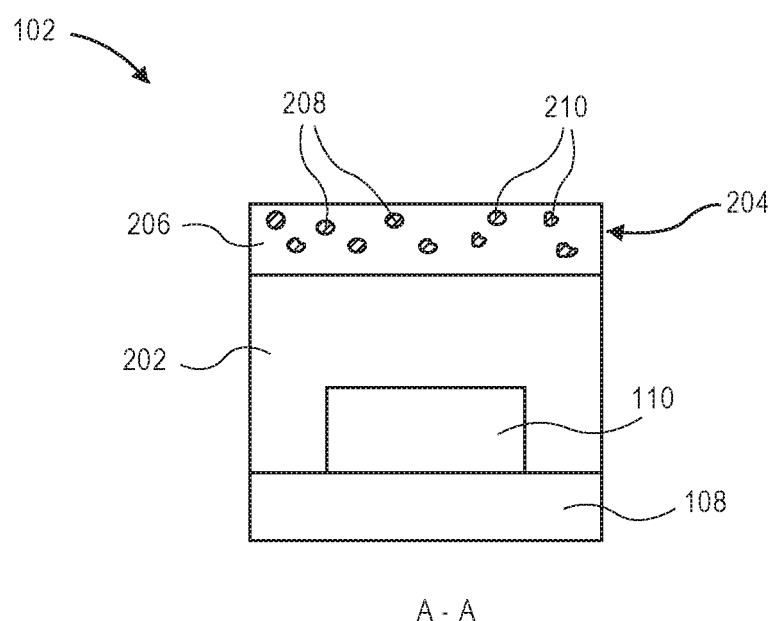
FIG. 2 illustrates a sectional view, taken about line A-A of FIG. 1, of a semiconductor package having a shielding layer, in accordance with an embodiment.

Referring to FIG. 2, a sectional view, taken about line A-A of FIG. 1, of a semiconductor package having a shielding layer is shown in accordance with an embodiment. Semiconductor package 102 may include a polymer layer 202 over semiconductor die 110. For example, polymer layer 202 may include a cured, injectable liquid polymer covering several sides of semiconductor die 110. More particularly, polymer layer 202 may encapsulate semiconductor die 110 over package substrate 108. For example, a bottom surface of semiconductor die 110 may be mounted on package substrate 108, and polymer layer 202 may cover and contact a top and peripheral sides of semiconductor die 110 above package substrate 108.

In an embodiment, semiconductor package 102 includes a shielding layer 204 over polymer layer 202. More particularly, shielding layer 204 may include a resin matrix 206 covering a top surface of polymer layer 202 above semiconductor die 110. Resin matrix 206 may be loaded with metal particles 208. That is, several metal particles 208 may be embedded in resin matrix 206. Resin matrix 206 may be formed from any of various types of resin materials. For example, resin matrix 206 may include an epoxy, acrylic, epoxy-acrylic, urethane blend, urethane, silicone neoprene, or other types of epoxies, hybrid materials, elastomers, etc.

Metal particles 208 in resin matrix 206 may attenuate EMI, and more particularly, a type of metal particle 208 may be selected to attenuate EMI having a predetermined frequency or range of frequencies. In an embodiment, metal particles 208 include magnetic particles 210. Magnetic particles 210 may provide EMI shielding based on absorption of electromagnetic energy. For example, magnetic particles 210 may absorb microwave or other radio frequency interference signals that pose a potential disturbance to the efficacy of semiconductor package 102. Since EMI shielding provided by magnetic particles 210 is based on absorption of energy, shielding layer 204 may not require electrical grounding.

Magnetic particles 210 may include various shapes and materials. For example, magnetic particles 210 may be spherical particles, or may have an irregular shape, e.g., flakes, fibers, filings, etc. Magnetic particles 210 may incorporate a magnetic material such as ferrites, nickel-zinc, or iron. By way of example, magnetic particles 210 may include powdered iron fillers that are mixed into resin matrix 206 and transferred onto polymer layer 202 as described below.

The material used to form metal particles 208 may control an attenuation range of shielding layer 204. For example, in the case of magnetic particles 210 described above, magnetic particles 210 may attenuate EMI having a frequency in a range of 500 MHz to 18 GHz. Accordingly, shielding layer 204 may include one or more different types of magnetic particles 210 to attenuate a predetermined frequency band of EMI. That is, a first type of magnetic particle 210 having a first magnetic material may be loaded in resin matrix 206 to attenuate a first frequency range of EMI, and a second type of magnetic particle 210 having a second magnetic material may be loaded in resin matrix 206 to attenuate a second frequency range of EMI. Accordingly, an ability of shielding layer 204 to attenuate EMI may be tuned as needed.

Figure 3:
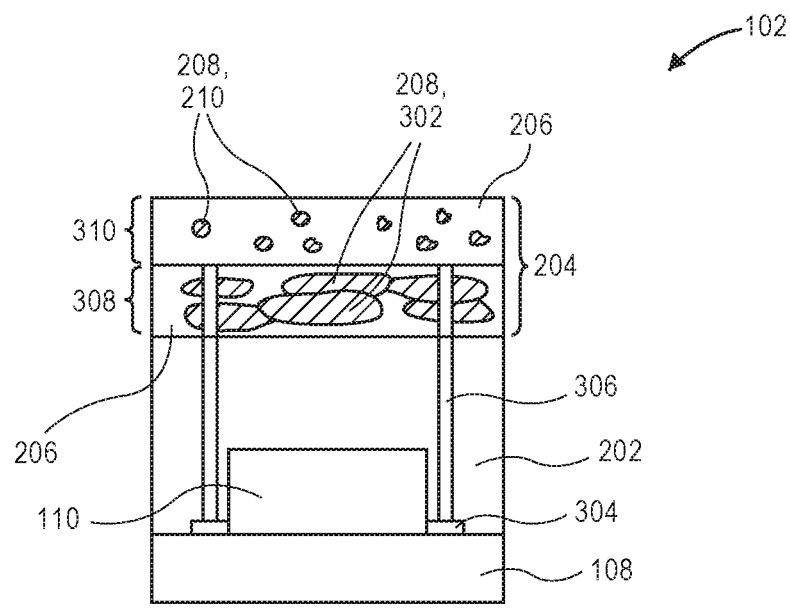
FIG. 3 illustrates a sectional view, taken about line A-A of FIG. 1, of a semiconductor package having a shielding layer electrically connected to a package substrate, in accordance with an embodiment.

Referring to FIG. 3, a sectional view, taken about line A-A of FIG. 1, of a semiconductor package having a shielding layer electrically connected to a package substrate is shown in accordance with an embodiment. Metal particles 208 may include conductive particles 302. Conductive particles 302 in resin matrix 206 may attenuate EMI, and more particularly, conductive particles 302 may shield EMI based on conduction. Accordingly, conductive particles 302 may be electrically connected to each other in resin matrix 206.

Electrical conductivity of conductive particles 302 in resin matrix 206 may be provided by loading conductive particles 302 into resin matrix 206 with a sufficient density to ensure that conductive particles 302 touch to create a conductive path across a lateral plane of shielding layer 204. For example, an epoxy resin matrix 206 may contain 70-80% by volume conductive particles 302, such that, on average, conductive particles 302 are closely packed and in contact with adjacent conductive particles 302.

Conductive particles 302 may include various shapes. For example, conductive particles 302 may be spherical particles, or may have an irregular shape, e.g., a flake, fiber, strand, filing, etc., which may be on a nm or micron scale. In an embodiment, irregularly shaped conductive particles 302 may allow for more particles to be packed into resin matrix 206 per unit volume. Accordingly, irregularly shaped conductive particles 302 may increase a conductivity of shielding layer 204.

Conductive particles 302 may include various materials. For example, conductive particles 302 may include nickel or silver-plated copper or stainless steel, silver-plated aluminum, silver-plated glass, silver-nickel, sintered metal pastes, or other alloys or silver-based conductive particles 302.

As described above, the material used to form metal particles 208 may control an attenuation range of metal particles 208. For example, in the case of conductive particles 302 described above, conductive particles 302 may attenuate EMI having a frequency in a range greater than 1 GHz. By way of example, conductive particles 302 formed from nickel and silver-plated copper particle resin blends may provide an EMI attenuation in a range greater than 65 dB. Also by way of example, conductive particles 302 formed from silver may provide an EMI attenuation in a range of 80-90 dB, e.g., 85 dB. Accordingly, shielding layer 204 may include one or more different types of conductive particles 302 to attenuate a predetermined frequency band of EMI.

Shielding layer 204 may be electrically grounded. More particularly, conductive particles 302 in resin matrix 206 may be electrically connected to package substrate 108 of semiconductor package 102. In an embodiment, shielding layer 204 is electrically connected to a grounding pad 304 on package substrate 108. Grounding pad 304 may be a conductive contact, e.g., a deposited copper pad, on an upper surface of package substrate 108. Thus, grounding pad 304 may be laterally beside semiconductor die 110 and may also be encapsulated by polymer layer 202.

In an embodiment, shielding layer 204 is electrically connected to grounding pad 304 by a via 306. Via 306 may extend through shielding layer 204 and/or polymer layer 202 to grounding pad 304. More particularly, via 306 may include a conductive material, e.g., copper, filling a via hole laser drilled through conductive particles 302, resin matrix 206, and polymer layer 202. Thus, via 306 may be electrically connected to conductive particles 302 and grounding pad 304 to electrically ground shielding layer 204 to package substrate 108.

Semiconductor package 102 may include a shielding layer 204 having both magnetic particles 210 and conductive particles 302. For example, shielding layer 204 may include a first layer 308 and a second layer 310 containing respective types of metal particles 208. In an embodiment, first layer 308 includes conductive particles 302 electrically connected to each other in resin matrix 206, as described above. Second layer 310, by contrast, may include magnetic particles 210 in resin matrix 206, as described above with respect to FIG. 2. Thus, shielding layer 204 may provide hybrid functionality by attenuating EMI based on both conduction and absorption. That is, shielding layer 204 may shield a broad band of EMI frequencies according to the types of conductive particles 302 and magnetic particles 210 included in resin matrix 206 of shielding layer 204.

In an embodiment, shielding layer 204 includes a mixture of conductive particles 302 and magnetic particles 210 within a same lateral plane (not shown). For example, first layer 308 having conductive particles 302 and second layer 310 having magnetic particles 210 may be a same layer. Accordingly, magnetic particles 210 may be interspersed between conductive particles 302 of shielding layer 204. When conductive particles 302 are loaded in resin matrix 206 at a sufficient density, e.g., greater than 50% by volume, conductivity of shielding layer 204 may be maintained even though some conductive particles 302 may be separated from other conductive particles 302 by one or more magnetic particles 210. Thus, the hybrid functionality of shielding layer 204 having both conductive particles 302 and magnetic particles 210 may be maintained.

Figure 4:
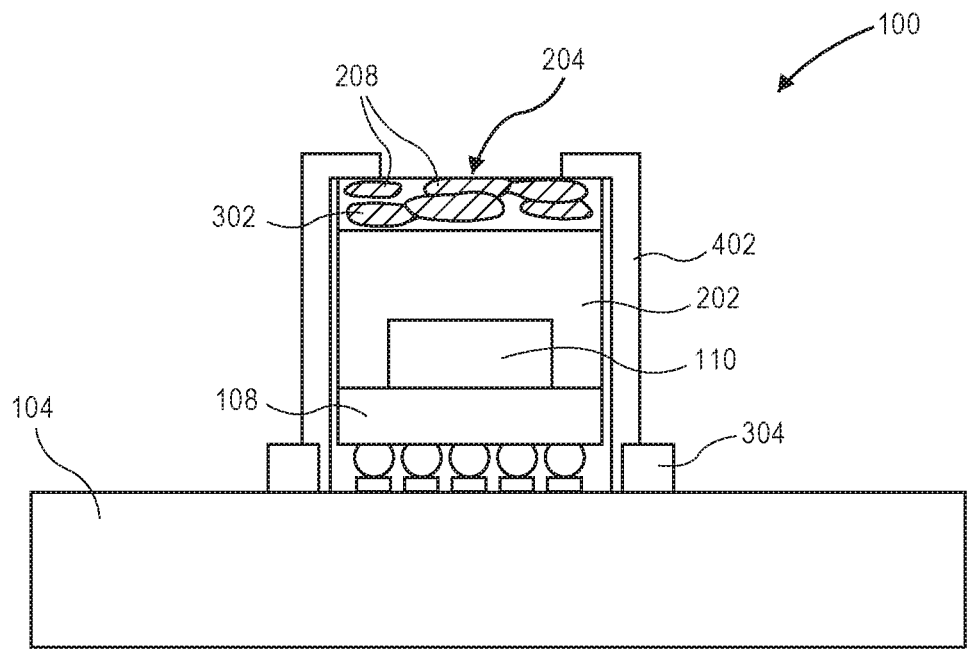
FIG. 4 illustrates a semiconductor package assembly having a shielding layer electrically connected to a circuit board, in accordance with an embodiment.

Referring to FIG. 4, a semiconductor package assembly having a shielding layer electrically connected to a circuit board is shown in accordance with an embodiment. Semiconductor package assembly 100 may include semiconductor packages 102, as described above, mounted on circuit board 104. More particularly, circuit board 104 may be electrically connected to semiconductor package 102 having shielding layer 204 loaded with metal particles 208. In a case of shielding layer 204 having conductive particles 302 electrically connected to each other in resin matrix 206, shielding layer 204 may be electrically connected to grounding pad 304 on circuit board 104. That is, grounding pad 304 may be formed on circuit board 104 rather than package substrate 108, and thus, shielding layer 204 may be electrically grounded to circuit board 104 at the board level rather than package substrate 108 at the package level.

In an embodiment, a grounding structure 402 extends from shielding layer 204 to grounding pad 304 on circuit board 104. For example, grounding structure 402 may include a metallized can or metallized cloth attached to shielding layer 204 at a first contact point and to grounding pad 304 at a second contact point. Alternatively, grounding structure 402 may include an electrical lead, e.g., a conductive wire, attached to shielding layer 204 at the first contact point and to grounding pad 304 at the second contact point. Grounding structure 402 may include a sputtered film as well. For example, a sputtering process may be applied to semiconductor package 102 attached to circuit board 104 such that a sputtered film is grown across a portion of shielding layer 204 and along a peripheral side of semiconductor package 102 to extend to and overlap grounding pad 304 on circuit board 104. Accordingly, shielding layer 204 may be grounded to package substrate 108 or to circuit board 104 in numerous manners.

Figure 5:
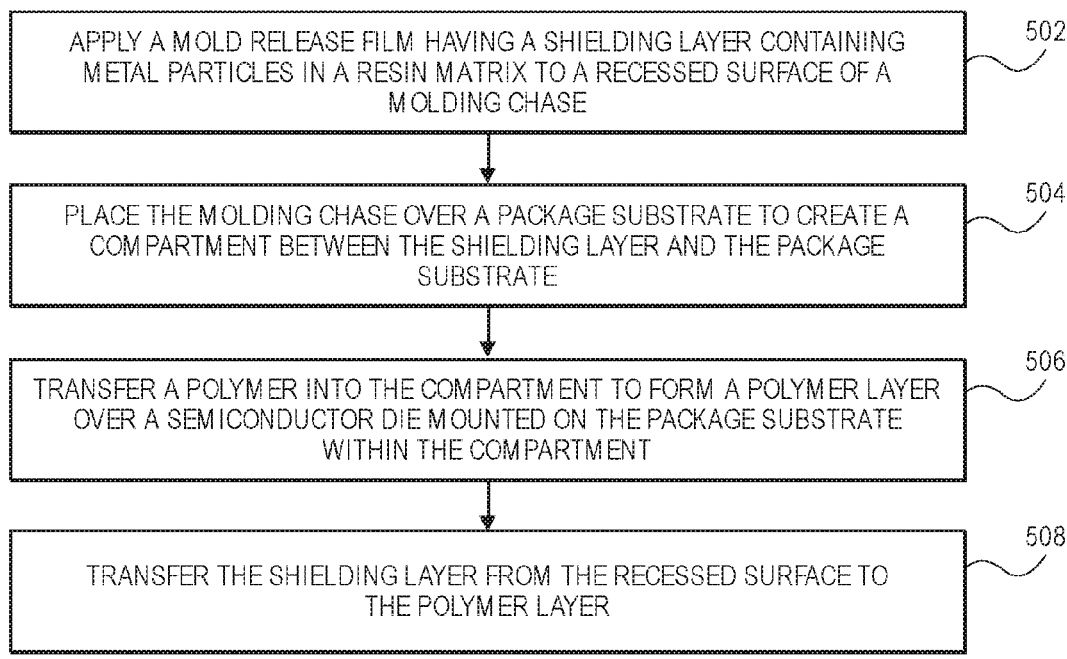
FIG. 5 illustrates a method of fabricating a semiconductor package having a shielding layer, in accordance with an embodiment.

Semiconductor package 102 having shielding layer 204 to attenuate EMI may be formed in a method that includes transferring shielding layer 204 to polymer layer 202 as part of a polymer molding operation. Referring to FIG. 5, a method of fabricating a semiconductor package having a shielding layer is shown in accordance with an embodiment. The method corresponds to depictions represented in FIGS. 6-8, and thus, shall be described below with alternating reference to each of those figures.

Figure 6:
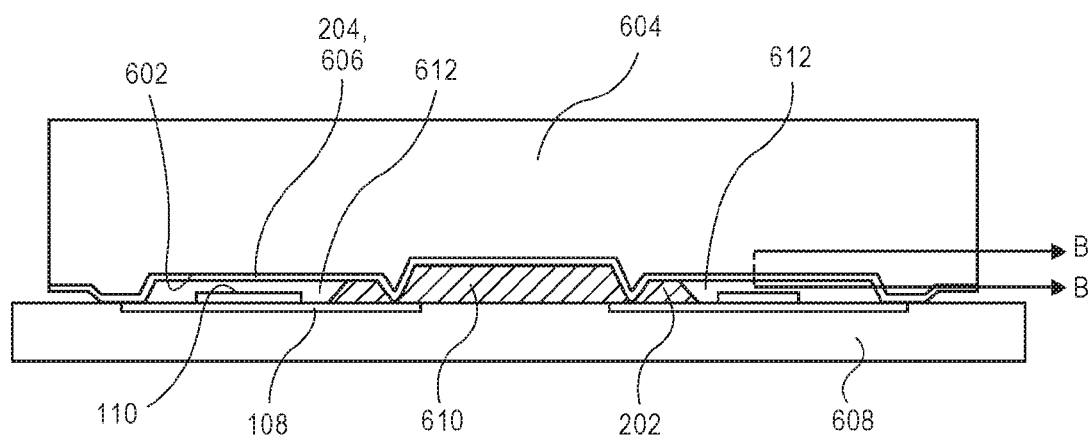
FIG. 6 illustrates an operation in a method of fabricating a semiconductor package having a shielding layer, in accordance with an embodiment.

Referring to FIG. 6, an operation in a method of fabricating a semiconductor package having a shielding layer is shown in accordance with an embodiment. At operation 502, a mold release film 606 may be applied to or onto a recessed surface 602 of a molding chase, e.g., a top molding chase 604. For example, mold release film 606 may be provided in a roll format. The roll of film may be fed into the molding tool by transmission mechanisms such as roller systems of existing molding equipment. Accordingly, after feeding mold release film 606 into the tool, a vacuum may be applied to suction mold release film 606 against relief features of top molding chase 604. More particularly, mold release film 606 may be held against recessed surface 602 by the vacuum suction. Alternatively, mold release film 606 may be applied on recessed surface 602 using other techniques, e.g., by coating recessed surface 602 with mold release film 606. Mold release film 606 may include one or more layers, and at least one of the layers may be shielding layer 204. Thus, mold release film 606 may contain metal particles 208, e.g., conductive particles 302, in resin matrix 206.

Recessed surface 602 may include a portion of a surface of a top molding chase 604 facing a lower molding chase 608. In an embodiment, recessed surface 602 is lowered into place over semiconductor die 110 and package substrate 108. More particularly, at operation 504, upper molding chase 604 may be placed over package substrate 108 and/or lower molding chase 608 to create a compartment 612 between recessed surface 602 and package substrate 108. For example, package substrate 108 may be moved into compartment 612 of the molding tool by handling systems. Compartment 612 may be between shielding layer 204 of mold release film 606 and an upper surface of package substrate 108. Upper molding chase 604 may be moved down to clamp over package substrate 108. That is, upper molding chase 604 may clamp down on a surface of lower molding chase 608 to enclose package substrate 108 in compartment 612. Accordingly, semiconductor die 110 may be mounted on package substrate 108 within compartment 612 when upper molding chase 604 is set against lower molding chase 608.

At operation 506, a polymer 610 may be transferred into compartment 612. More particularly, the transferred polymer 610 may form polymer layer 202 over semiconductor die 110 by filling compartment 612 between shielding layer 204 of mold release film 606 and package substrate 108. Accordingly, the transferred polymer 610 may form polymer layer 202 over semiconductor die 110.

Transferring polymer 610 may occur in a molding process of any kind. For example, polymer 610 may be injected, i.e., transferred in an injection molding process. Furthermore, polymer 610 may be transferred, i.e., transferred in a transfer molding process. Accordingly, this description applies to all types of molding processes. That is, compartment 612 may be filled by polymer 610 in any type of molding process. After filling compartment 612 with polymer 610, at least a portion of polymer layer 202 may be in contact with shielding layer 204. Thus, shielding layer 204 and polymer layer 202 may appose each other in preparation for releasing shielding layer 204 onto polymer layer 202.

Figure 7:
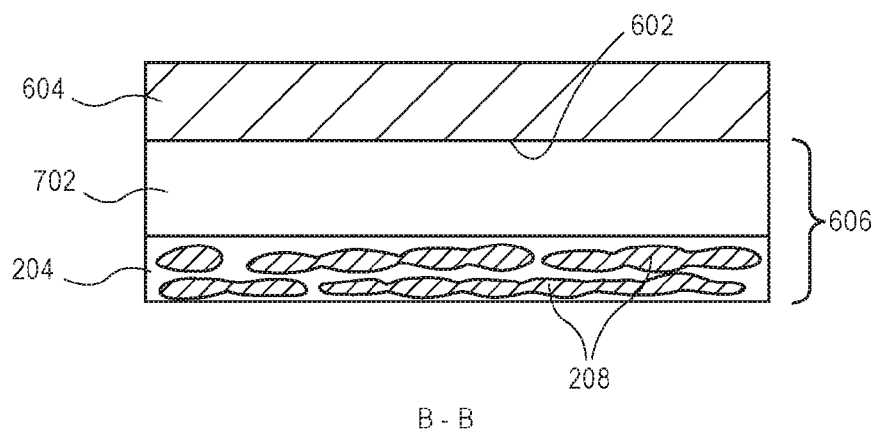
FIG. 7 illustrates a sectional view, taken about line B-B of FIG. 6, of a mold release film used in a method of fabricating a semiconductor package having a shielding layer, in accordance with an embodiment.

Referring to FIG. 7, a sectional view, taken about line B-B of FIG. 6, of a mold release film used in a method of fabricating a semiconductor package having a shielding layer is shown in accordance with an embodiment. Mold release film 606 on upper molding chase 604 may include several separate layers. For example, in addition to shielding layer 204 containing metal particles 208, mold release film 606 may include a base film 702. Base film 702 may be applied to upper molding chase 604 between recessed surface 602 and shielding layer 204 as described above. Thus, base film 702 may provide an intermediate film layer between shielding layer 204 and upper molding chase 604.

In an embodiment, base film 702 is a film or foil having a low glass transition temperature. For example, the glass transition temperature of base film 702 may be in a range of 80-125° C. For example, base film 702 may include polyethylene terephthalate (PET), ethylene tetrafluoroethylene (ETFE), or polystyrene-based films. ETFE typically includes a glass transition temperature ranging from 80-90° C., and polystyrene and PET-based films typically include a glass transition temperature ranging from 100-115° C. in an embodiment, base film 702 has a laminated structure, e.g., a bilayer structure, incorporating layers having different glass transition temperatures, and thus, base film 702 may be tuned to provide the mechanical properties necessary to release shielding layer 204 onto polymer layer 202, as described below.

At operation 508, shielding layer 204 may be transferred from recessed surface 602 to polymer layer 202. That is, the metallized shielding layer 204 may be designed to be released and transferred to polymer 610 during the molding process. For example, the transfer of shielding layer 204 may occur when the transferred polymer 610 is being cured within compartment 612. Since the lamination of shielding layer 204 on polymer layer 202 is integral to the curing process, additional tooling or equipment may not be required for EMI shielding.

Polymer 610 may be cured during the molding process through the application of elevated temperatures. For example, the molding chase may be subjected to molding conditions, i.e., high temperatures, provided by an oven. In an embodiment, as a base film of base film 702 having a low glass transition temperature and resin matrix 206 of shielding layer 204 increases, base film 702 and shielding layer 204 may separate and the conductive matrix may adhere to the cured polymer layer 202 to form an EMI shield over polymer layer 202, semiconductor die 110, and package substrate 108. Curing of polymer 610 may occur in an oven at a temperature higher than 100° C., e.g., 175° C. for more than 1 hour, e.g., 4-5 hours. Thus, as polymer 610 cures and a temperature of mold release film 606 increases, shielding layer 204 may slowly release from base film 702 to attach to polymer layer 202.

Figure 8:
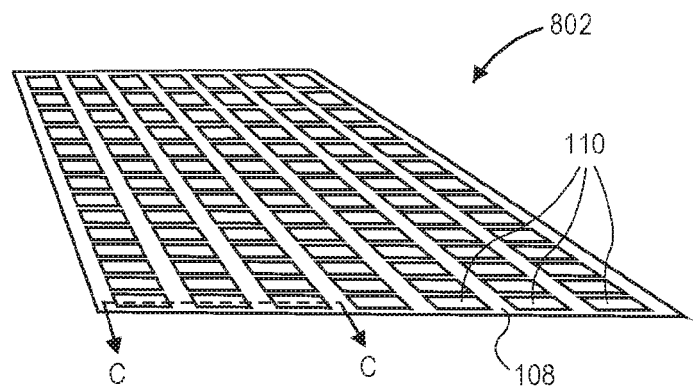
FIG. 8 illustrates a perspective view of a die strip used in a method of fabricating a semiconductor package having a shielding layer, in accordance with an embodiment.

Referring to FIG. 8, a perspective view of a die strip used in a method of fabricating a semiconductor package having a shielding layer is shown in accordance with an embodiment. A die strip 802 may include a sheet of package substrate 108 material having several semiconductor dies 110 mounted on the sheet. For example, die strip 802 may contain tens to hundreds, e.g., 40-200, individual silicon-based semiconductor dies 110 mounted in a matrix pattern on package substrate 108. Accordingly, die strip 802 may be processed in a molding chase as described above. More particularly, several semiconductor dies 110, e.g., every semiconductor die 110 of die strip 802, may be disposed within compartment 612 when upper molding chase 604 is placed over package substrate 108 of die strip 802. Accordingly, polymer layer 202 may be simultaneously formed over semiconductor dies 110 of die strip 802 during a single molding process. Thus, shielding layer 204 may be simultaneously released onto an entire upper surface of die strip 802 during the molding process using standard film-assisted molding chase equipment.

Figure 9:
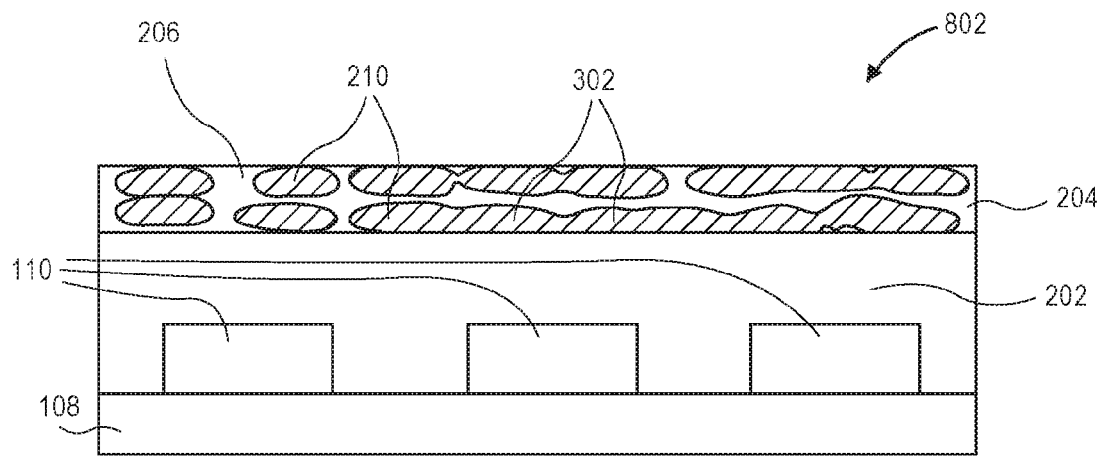
FIG. 9 illustrates a sectional view, taken about line C-C of FIG. 8, of a die strip having a shielding layer, in accordance with an embodiment.

Referring to FIG. 9, a sectional view, taken about line C-C of FIG. 8, of a die strip having a shielding layer is shown in accordance with an embodiment. After the molding process, the molding chases 604, 608 may be separated and the resultant die strip 802 having shielding layer 204 may be removed from the molding equipment. In an embodiment, the resultant die strip 802 includes several semiconductor dies 110 mounted on package substrate 108 and polymer layer 202 covered by shielding layer 204. Shielding layer 204 may include conductive particles 302 and/or magnetic particles 210 in resin matrix 206. Thus, the resultant die strip 802 may be singulated to produce several individual semiconductor packages 102 or semiconductor package assemblies 100 as shown and described with respect to FIGS. 2 and 4.

Figure 10:
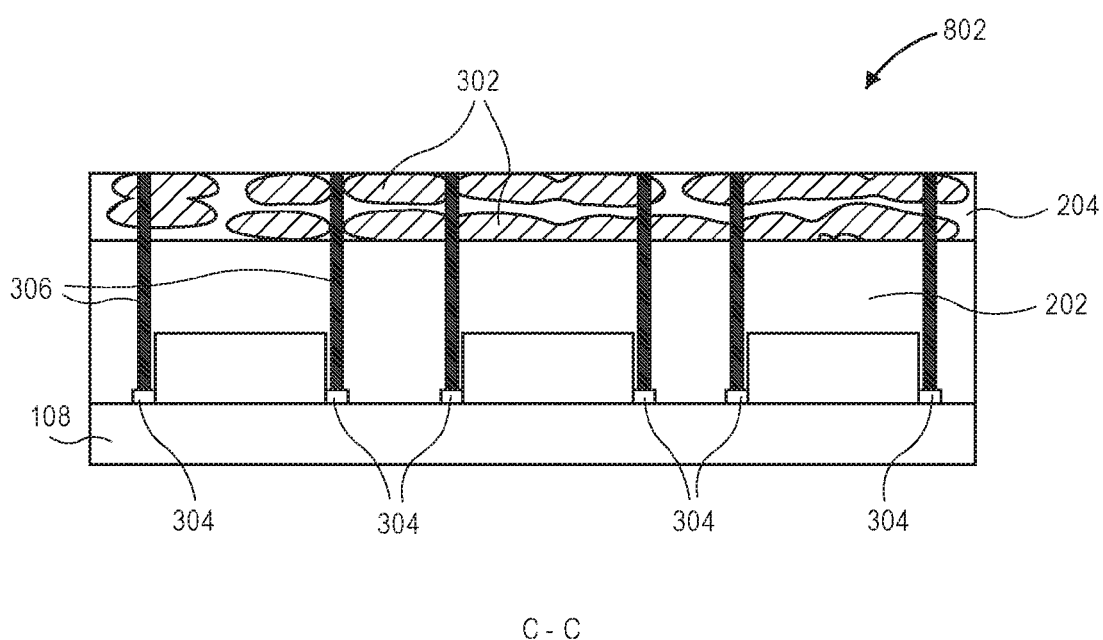
FIG. 10 illustrates a sectional view, taken about line C-C of FIG. 8, of a die strip having a shielding layer electrically connected to a package substrate, in accordance with an embodiment.

Referring to FIG. 10, a sectional view, taken about line C-C of FIG. 8, of a die strip having a shielding layer electrically connected to a package substrate is shown in accordance with an embodiment. Grounding pads 304 may be formed on die strip 802 prior to the molding process. Accordingly, forming polymer layer 202 over semiconductor dies 110 may also cover grounding pads 304. Thus, after removing the resultant die strip 802 from the molding chase equipment, vias 306 may be opened, e.g., using a laser milling process, and a conductive epoxy may be inserted into the via holes to connect conductive particles 302 in shielding layer 204 to grounding pads 304. Thus, shielding layer 204 may be electrically connected to grounding pads 304 on package substrate 108 through polymer layer 202. The resultant die strip 802 having a conductive shielding layer 204 may be singulated to produce several individual semiconductor packages 102 or semiconductor package assemblies 100 as shown and described with respect to FIG. 3.

Singulated semiconductor packages 102 may proceed with subsequent process operations for package level assembly and/or board level assembly. For example, package level assembly may proceed, e.g., by attaching solder balls to package substrate 108 and/or mounting top package portion 106 over the singulated semiconductor package 102. Similarly, board level assembly may proceed, e.g., by attaching the solder balls of semiconductor package 102 to circuit board 104 and/or attaching grounding structure 402 between shielding layer 204 and a grounding pad 304 on circuit board 104 to electrically connect shielding layer 204 to the grounding pad 304.

Figure 11:
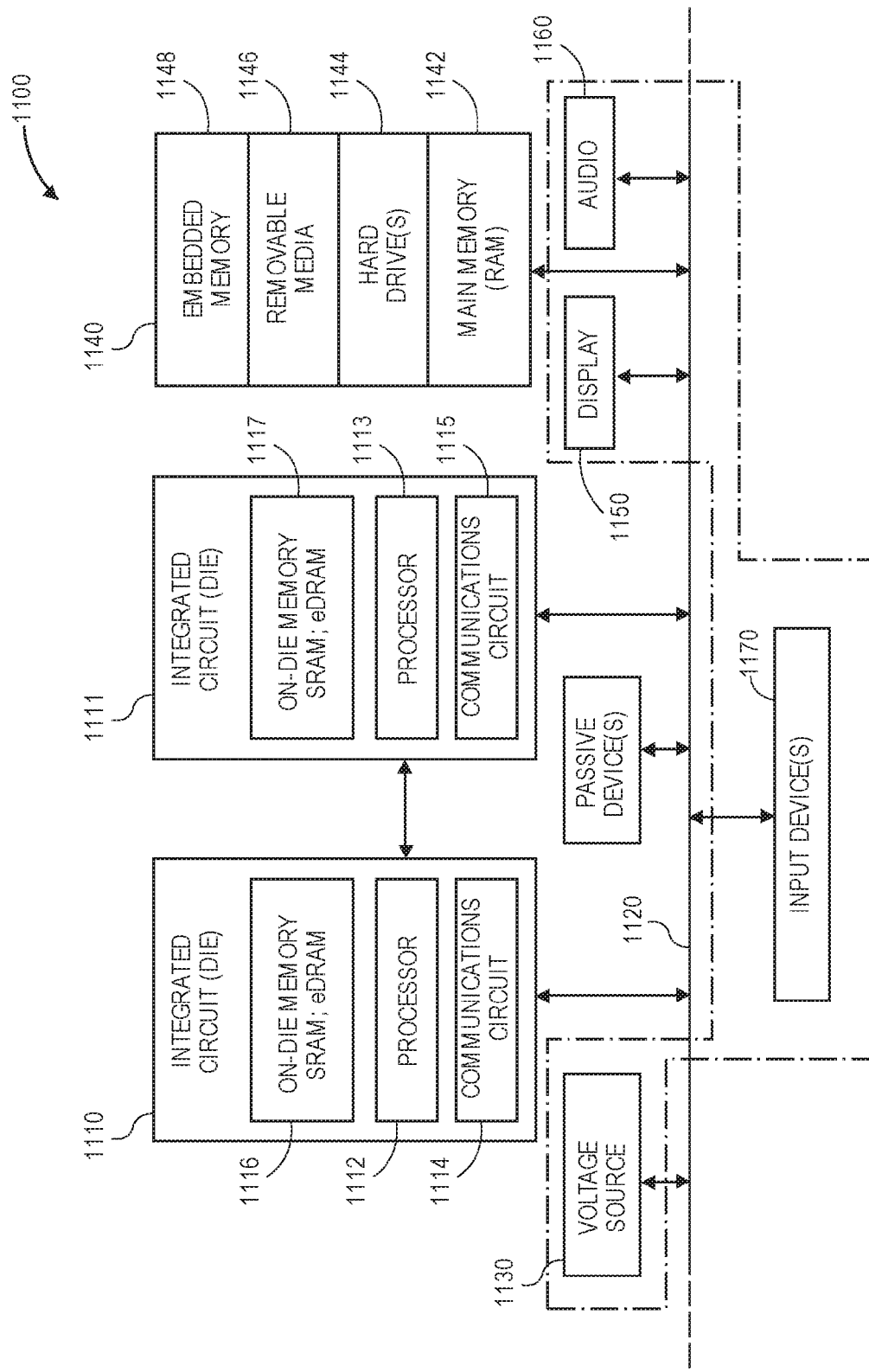
FIG. 11 is a schematic of a computer system, in accordance with an embodiment.

FIG. 11 is a schematic of a computer system, in accordance with an embodiment. The computer system 1100 (also referred to as the electronic system 1100) as depicted can embody a semiconductor package having a shielding layer containing metal particles, e.g., conductive particles or magnetic particles, in a resin matrix to attenuate electromagnetic interference, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits, according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, a semiconductor package having a shielding layer containing metal particles, e.g., conductive particles or magnetic particles, in a resin matrix to attenuate electromagnetic interference, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1111 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as a first die in a die stack, according to an embodiment.

In an embodiment, the electronic system 1100 also includes a display device 1150, and an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments including a semiconductor package having a shielding layer containing metal particles, e.g., conductive particles or magnetic particles, in a resin matrix to attenuate electromagnetic interference, according to any of the several disclosed embodiments and their equivalents, an electronic system, a computer system, one or more methods of fabricating an integrated circuit, and one or more methods of fabricating an electronic assembly that includes a semiconductor package having a shielding layer containing metal particles, e.g., conductive particles or magnetic particles, in a resin matrix to attenuate electromagnetic interference, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages having a shielding layer containing metal particles, e.g., conductive particles or magnetic particles, in a resin matrix to attenuate electromagnetic interference embodiments and their equivalents. A foundation substrate may be included, as represented by the dashed line of FIG. 11. Passive devices may also be included, as is also depicted in FIG. 11.

Embodiments of semiconductor packages having a shielding layer to attenuate EMI, and methods of forming such semiconductor packages, are described. In an embodiment, a semiconductor package includes a package substrate, a semiconductor die mounted on the package substrate, a polymer layer over the semiconductor die, and a shielding layer over the polymer layer. The shielding layer includes several metal particles in a resin matrix to attenuate electromagnetic interference (EMI).

In one embodiment, the several metal particles include several conductive particles electrically connected to each other in the resin matrix.

In one embodiment, the conductive particles attenuate EMI having a frequency greater than 1 GHz.

In one embodiment, the semiconductor package further includes a grounding pad on the package substrate, and a via extending through the shielding layer and the polymer layer to the grounding pad to electrically connect the shielding layer to the grounding pad.

In one embodiment, the several metal particles include several magnetic particles.

In one embodiment, the magnetic particles attenuate EMI having a frequency in a range of 500 MHz to 18 GHz.

In one embodiment, the several metal particles include several conductive particles and several magnetic particles. The shielding layer includes a first layer having the several conductive particles electrically connected to each other in the resin matrix, and a second layer having the several magnetic particles.

In an embodiment, a semiconductor package assembly includes a semiconductor package and a circuit board. The semiconductor package includes a package substrate, a semiconductor die mounted on the package substrate, a polymer layer over the semiconductor die, and a shielding layer over the polymer layer. The shielding layer includes several metal particles in a resin matrix to attenuate electromagnetic interference (EMI). The semiconductor package is mounted on the circuit board.

In one embodiment, the several metal particles include several conductive particles electrically connected to each other in the resin matrix.

In one embodiment, the conductive particles attenuate EMI having a frequency greater than 1 GHz.

In one embodiment, the semiconductor package assembly further includes a grounding pad on the package substrate, and a via extending through the shielding layer and the polymer layer to the grounding pad to electrically connect the shielding layer to the grounding pad.

In one embodiment, the semiconductor package assembly further includes a grounding pad on the circuit board, and a grounding structure extending from the shielding layer to the grounding pad to electrically connect the shielding layer to the grounding pad.

In one embodiment, the several metal particles include several magnetic particles.

In one embodiment, the magnetic particles attenuate EMI having a frequency in a range of 500 MHz to 18 GHz.

In one embodiment, the shielding layer includes a first layer having several conductive particles electrically connected to each other in the resin matrix, and a second layer having several magnetic particles.

In an embodiment, a method of fabricating a semiconductor package having a shielding layer includes applying a mold release film to a recessed surface of a molding chase. The mold release film includes a shielding layer having several metal particles in a resin matrix. The method includes placing the molding chase over a package substrate to create a compartment between the shielding layer and the package substrate. A semiconductor die is mounted on the package substrate within the compartment. The method includes transferring a polymer into the compartment. The transferred polymer forms a polymer layer over the semiconductor die between the shielding layer and the package substrate. The method includes transferring the shielding layer from the recessed surface to the polymer layer.

In one embodiment, the mold release film includes a base film between the recessed surface and the shielding layer. The base film includes a glass transition temperature in a range of 80 to 125 degrees Celsius.

In one embodiment, transferring the shielding layer includes curing the transferred polymer.

In one embodiment, the method further includes forming a via through the shielding layer and the polymer layer to a grounding pad on the package substrate to electrically connect the shielding layer to the grounding pad.

In one embodiment, the method further includes mounting the package substrate on a circuit board having a grounding pad. The method includes attaching a grounding structure to the shielding layer and the grounding pad to electrically connect the shielding layer to the grounding pad.

What is claimed is:

1. A semiconductor package, comprising:
a package substrate;
a semiconductor die mounted on the package substrate;
a polymer layer over the semiconductor die;
a shielding layer over the polymer layer, wherein the shielding layer includes a plurality of metal particles in a resin matrix to attenuate electromagnetic interference; and
a grounding structure extending from the shielding layer to a grounding pad to electrically connect the shielding layer to the grounding pad, wherein the grounding structure is a via extending through the polymer layer to the grounding pad on the package substrate, wherein the via extends through the shielding layer.

2. The semiconductor package of claim 1, wherein the plurality of metal particles include a plurality of conductive particles electrically connected to each other in the resin matrix.

3. The semiconductor package of claim 2, wherein the plurality of metal particles include a plurality of magnetic particles.

4. The semiconductor package of claim 3, wherein the shielding layer includes a first layer having the plurality of conductive particles, and a second layer having the plurality of magnetic particles.

5. The semiconductor package of claim 1, wherein the grounding pad
is laterally beside the semiconductor die between the polymer layer and the package substrate.

6. A semiconductor package assembly, comprising:
a circuit board;
a semiconductor package mounted on the circuit board, the semiconductor package including
a package substrate,
a semiconductor die mounted on the package substrate,
a polymer layer over the semiconductor die, and
a shielding layer over the polymer layer, wherein the shielding layer includes a plurality of metal particles in a resin matrix to attenuate electromagnetic interference; and
a grounding structure extending from the shielding layer to a grounding pad to electrically connect the shielding layer to the grounding pad, wherein the grounding pad is on the package substrate, and wherein the grounding structure includes a via extending through the polymer layer to the grounding pad wherein the via extends through the shielding layer.

7. The semiconductor package assembly of claim 6, wherein the plurality of metal particles include a plurality of conductive particles electrically connected to each other in the resin matrix.

8. The semiconductor package assembly of claim 7, wherein the plurality of metal particles include a plurality of magnetic particles.

9. The semiconductor package assembly of claim 8, wherein the shielding layer includes a first layer having the plurality of conductive particles, and a second layer having the plurality of magnetic particles.

10. The semiconductor package assembly of claim 6, wherein the grounding pad is on the circuit board, wherein the semiconductor package includes a peripheral side, and wherein the grounding structure extends along the peripheral side from a first contact point on the shielding layer to a second contact point on the grounding pad.

11. The semiconductor package assembly of claim 10, wherein the grounding structure includes one or more of a metallized can, a metallized cloth, an electrical lead, or a film attached to the shielding layer at the first contact point and attached to the grounding pad at the second contact point.

12. A method, comprising:
mounting a semiconductor die on a package substrate;
forming a polymer layer over the semiconductor die;
forming a shielding layer over the polymer layer, wherein the shielding layer includes a plurality of metal particles in a resin matrix to attenuate electromagnetic interference; and
forming a grounding structure, wherein the grounding structure extends from
the shielding layer to a grounding pad to electrically connect the shielding layer to the grounding pad, wherein the grounding pad is on the package substrate, and wherein forming the grounding structure includes forming a via through the polymer layer to the grounding pad to electrically connect the shielding layer to the grounding pad, wherein forming the grounding structure includes forming the via through the shielding layer.

13. The method of claim 12, wherein the grounding pad is on a circuit board, and wherein forming the grounding structure includes
mounting the package substrate on the circuit board,
attaching the grounding structure to a first contact point on the shielding layer,
and attaching the grounding structure to a second contact point on the grounding pad.

14. The method of claim 13, wherein the grounding structure includes one or more of a metallized can, a metallized cloth, an electrical lead, or a conductive film attached to the shielding layer at the first contact point and attached to the grounding pad at the second contact point.

* * * * *